United States Patent [19]

Kitamura et al.

[11] Patent Number: 5,096,546
[45] Date of Patent: Mar. 17, 1992

[54] PROCESS FOR TREATING SURFACE OF COPPER FOIL

[75] Inventors: Nobuo Kitamura, Ageo; Makoto Fujiki, Ina; Yukio Kodama, Kashiwa; Katsuhiro Yoshimura, Omiya, all of Japan

[73] Assignee: Mitsui Kinzoku Kogyo Kabushiki Kaisha, Tokyo, Japan

[21] Appl. No.: 486,390

[22] Filed: Feb. 28, 1990

[30] Foreign Application Priority Data

Sep. 11, 1989 [JP] Japan .................................. 1-235166

[51] Int. Cl.$^5$ ................................................. C25D 7/06
[52] U.S. Cl. .................................... 205/155; 205/177
[58] Field of Search ..................................... 204/27, 40

[56] References Cited

U.S. PATENT DOCUMENTS 3,585,010  6/1971  Luce et al. .......................... 204/44
4,456,508  6/1984  Torday ................................ 204/27
4,469,567  9/1984  Torday ................................ 204/27

FOREIGN PATENT DOCUMENTS 269208  6/1988  European Pat. Off. .

*Primary Examiner*—T. M. Tufariello
*Attorney, Agent, or Firm*—Stevens, Davis, Miller & Mosher

[57] ABSTRACT

The present invention relates to a process for treating a surface of a copper foil for producing the copper foil for a printed circuit board in which a zinc layer, a copper layer and a chromate layer are formed in turn on the copper foil. The product of the present invention is excellent in heat resistance and hydrochloric acid resistance and the process according to the present invention does not require the use of dangerous chemicals and is free from any problems on safety.

2 Claims, No Drawings

PROCESS FOR TREATING SURFACE OF COPPER FOIL

BACKGROUND OF THE INVENTION

The present invention relates to a process for treating a surface of a copper foil for a printed circuit board, particularly to a process for treating the surface of the copper foil wherein a zinc layer and a copper layer covering the zinc layer are formed on the surface of the copper foil and if necessary, an additional zinc layer is formed and a chromate layer is formed on these surfaces, whereby the reduction of the bond strength between the copper foil and a substrate by application of heat, and also the reduction of the corrosion resistance to hydrochloric acid are prevented.

Generally when a printed circuit board is manufactured, there is used a copper-clad laminate in which a copper foil is bonded to a supporting substrate.

In the case of manufacturing this printed circuit board by the use of such a copper-clad laminate, the copper-clad laminate is subjected to punching first, and the insides of the holes are activated. Then, copper is uniformly deposited by means of nonelectrolytic plating and further, the copper is electroplated to augment its thickness. Then, after applying a photoresist to the surface of the copper foil, pattern etching is conducted to obtain the objective circuit board. During the activating treatment of the inside of holes and the pattern etching treatment in this process, a bonding boundary layer between the copper foil and the substrate is exposed to a solution containing hydrochloric acid, and after performing the pattern etching treatment, the copper foil is immersed several times in the various plating solutions and acid cleaning solutions as pretreatment in the case of conducting various plating steps.

Accordingly, in the case that the above-stated step is conducted, the bonding boundary layer between the copper foil and the substrate is sometimes corroded by acids to deteriorate the bond strength. Also, in the case of bonding the copper foil to the substrate, it is heated to bond them under a pressure. Therefore, the stability of bond strength between the copper foil and the substrate becomes important in the step for preparing the printed circuit board.

For this reason, to the surface by which copper foil is bonded to a substrate, surface treatment is hitherto performed by means of electrodeposition which is performed by the use of copper foil as a cathode. That is, in order to enhance the bond strength between the copper foil and the substrate, a granular copper layer has been electrically deposited on the surface of the copper foil by burned plating, to thereby form a roughened surface. To prevent falling off thereof, a smooth copper plating is applied, at a limiting current density or less and to said electroplating surface is applied coating with a metal such as zinc, zinc alloys and the like for the purpose of rust resistance and heat resistance.

However, the above-stated copper foil covered with zinc or zinc alloys has not been provided with a satisfactory resistance to hydrochloric acid for the printed circuit board. For example, when the section of the copper foil produced by punching or pattern etching of the copper-clad laminate is exposed to a solution containing hydrochloric acid in the step for producing the printed circuit board, corrosion due to acid is caused at the boundary between said zinc type corrosion resistant layer and the substrate, resulting in problems that bond strength becomes unstable. Also, there is a problem on safety because any practical method other than a cyanide bath does not exist for electroplating brass which is an alloy of copper and zinc.

DETAILED DESCRIPTION OF THE INVENTION

An object of the present invention is to provide a process for producing a copper foil for a printed circuit board without any problem on safety, which is excellent in heat resistance and has a significantly improved resistance to hydrochloric acid.

The present invention is, in the case of producing a copper foil for a printed circuit board characterized by forming a zinc layer, copper layer and chromate layer in turn onto the surface of the copper foil, the surface of which is made roughened.

According to the preferable embodiment of the present invention, it is characterized that a zinc layer is further formed between said copper layer and said chromate layer.

The copper foil to be the subject of the present invention is electro-deposited copper foil or wrought copper foil treated for making the surface rough. One example of this making the surface rough is already stated; however, various well known methods are applicable if the object can be achieved.

The present invention is to produce copper foil which has heat resistance and also has an excellent resistance to hydrochloric acid as a printed circuit board by forming onto it a zinc layer, copper layer and chromate layer in turn, and by forming an additional zinc layer, if necessary, between the copper layer and the chromate layer.

Hereinafter, the present invention is detailedly illustrated. Onto the roughened surface of copper foil, zinc is electroplated first. An electrolyte bath used for the electroplating of this zinc includes various well known techniques and is not necessary to be specified; however, as one example, there are shown, in the followings, a bath composition and electroplating conditions in the case of using a potassium pyrophosphate bath.

| | |
|---|---|
| Potassium pyrophosphate | 50 to 150 g/l |
| Zinc pyrophosphate (tetrahydrate) | 8 to 30 g/l |
| pH | 10.5 to 11.5 |
| Temperature of bath | 35 to 50° C. |
| Cathode | copper foil |
| Anode | zinc plate |
| Cathode current density | 1 to 5 A/dm$^2$ |
| Electroplating time | 5 to 15 sec. |

In the range of the above-stated electroplating conditions, conditions are selected so that a desired amount of electrodeposition is obtained. As the amount of electrodeposition of zinc increases, so heat resistance is more improved; however, preferable amount is 100 to 1000 mg/m$^2$.

To the copper foil onto which zinc is electroplated by the above-stated step, is then applied copper electroplating. This electroplating is preferably performed in an alkali bath. Although a potassium pyrophosphate bath, a cyanide bath and the like are exemplified as a well known bath, one example of using a potassium pyrophosphate bath which is preferable from the respect of safety is shown in the followings with its electroplating condition:

| | |
|---|---|
| Potassium pyrophosphate | 150 to 400 g/l |
| Copper pyrophosphate (trihydrate) | 4 to 100 g/l |
| pH | 7.5 to 8.5 |
| Temperature of bath | 45 to 55° C. |
| Cathode | copper foil |
| Anode | copper plate |
| Cathode current density | 3 to 9 A/dm$^2$ |
| Electroplating time | 5 to 20 sec. |

In the above-stated range electroplating conditions are selected so that a desired amount of electrodeposition is obtained. This electroplating is preferably performed in a small amount enough to make the color tone of the surface covered with copper uniform, and if it becomes excessive, heat resistance decreases. The amount of copper electroplated is preferably 1000 to 5000 mg/m$^2$.

To the surface of copper foil electroplated with copper on the zinc layer by the above-stated step, is applied zinc electroplating, again, according to necessity; however, its amount is significantly small. An alkali bath is preferable for the method. One example of the electroplating condition using a potassium pyrophosphate bath is shown in the following.

| | |
|---|---|
| Potassium pyrophosphate | 20 to 50 g/l |
| Zinc pyrophosphate (tetrahydrate) | 3 to 6 g/l |
| pH | 10.5 to 11.5 |
| Temperature of bath | 35 to 45° C. |
| Cathode | copper foil |
| Anode | zinc plate |
| Cathode current density | 0.1 to 0.3 A/dm$^2$ |
| Electroplating time | 2 to 6 sec. |

The amount of zinc electrodeposited is decided as the upper limit in the range where the color of zinc is not noticed on the color tone of electroplating surface and is finely controlled in accordance with visual observation.

Then, chromate treatment is applied to the surface to be treated. This method includes various well known techniques and is not necessary to be specified; however, as one example, there are shown, in the following, the bath composition and electroplating conditions in the case of performing electrolytic chromate treatment for rust resistance by a chromic acid bath.

| | |
|---|---|
| Anhydrous chromic acid | 0.7 g/l |
| Temperature of bath | 25 to 30° C. |
| Cathode | copper foil |
| Anode | insoluble anode |
| Cathode current density | 0.5 A/dm$^2$ |
| Treating time | 5 sec. |

The above-stated treating process is applied by passing through respective steps of zinc plating, water rinsing, copper plating, water rinsing, if necessary zinc plating and water rinsing, chromate treatment for rust resistance, water rinsing, and drying in turn.

The copper foil thus treated is heated to fix it under a pressure to a glass epoxy FR-4 substrate and the like to prepare a copper-clad laminate.

EXAMPLE

On the copper foil for which the surface has been made roughened according to a conventionally known method were formed the zinc layer, copper layer, and chromate rust resistant layer, as shown in Table 1, in the range of the electroplating bathes and electroplating conditions. The product thus obtained was heated to fix it under a pressure to a glass epoxy FR-4 substrate to prepare a copper-clad laminate.

The heat deterioration of the bond strength and hydrochloric acid resistance in these copper-clad laminates were tested. Heat resistance is expressed by copper foil peeling strength at 177° C. after 10 hour heating, and a value of 0.36 kg/cm or more is demanded. Hydrochloric acid resistance is expressed by a degradation ratio of copper foil peeling strength obtained after immersing for 30 minutes a patterned piece having 0.8 mm width into hydrochloric acid diluted to a ratio of 1 to 2, and a value of 10% or less is demanded. The test pieces of conventional examples in which only a chromate rust resistant layer was formed and in which a zinc layer and a chromate rust resistant layer were formed were similarly tested.

From Table 1 it is understood that while those of conventional examples are difficult to satisfy simultaneously both the heat resistance performance and the hydrochloric acid resistance performance, copper foil treated by a method in accordance with Examples of the present invention can fully satisfy both performances.

TABLE 1

| | Amount of electrodeposition and its treatment on roughened surface of copper foil | | | | Performance of glass epoxy FR-4 substrate | | | | |
|---|---|---|---|---|---|---|---|---|---|
| | Amount of zinc on inner layer (mg/m$^2$) | Amount of copper on copper layer (mg/m$^2$) | Amount of zinc on outer layer (mg/m$^2$) | Presence or absence of chromate rust resistant layer | Peeling strength | | | Hydrochloric acid resistance | |
| | | | | | Original (kg/cm) | After 10 days at 177° C. (kg/cm) | Success or unsuccess in heat resistance | Ratio of deterioration (%) | Success or unsuccess |
| Example 1 | 200 | 1500 | 0 | Presence | 2.10 | 0.65 | ○ | 0.6 | ○ |
| Example 2 | 400 | 2000 | 0 | Presence | 2.08 | 1.00 | ○ | 0.4 | ○ |
| Example 3 | 600 | 2000 | 0 | Presence | 2.04 | 1.20 | ○ | 0.9 | ○ |
| Example 4 | 200 | 1500 | 15~20 | Presence | 2.19 | 0.70 | ○ | 0.7 | ○ |
| Example 5 | 400 | 2000 | 15~20 | Presence | 2.17 | 1.07 | ○ | 0.6 | ○ |
| Example 6 | 600 | 2000 | 15~20 | Presence | 2.16 | 1.10 | ○ | 0.7 | ○ |
| Example 7 | 1000 | 2000 | 15~20 | Presence | 2.10 | 1.52 | ○ | 0.8 | ○ |
| Conventional Example 1 | 0 | 0 | 0 | Presence | 2.10 | 0.00 | × | 0.9 | ○ |
| Conventional Example 2 | 0 | 0 | 20 | Presence | 2.05 | 0.00 | × | 1.1 | ○ |
| Conventional Example 3 | 0 | 0 | 200 | Presence | 2.04 | 0.86 | ○ | 14.0 | × |
| Conventional | 0 | 0 | 400 | Presence | 2.05 | 1.20 | ○ | 16.4 | × |

TABLE 1-continued

| Amount of electrodeposition and its treatment on roughened surface of copper foil | | | | Performance of glass epoxy FR-4 substrate | | | | |
| --- | --- | --- | --- | --- | --- | --- | --- | --- |
| | | | | Peeling strength | | | Hydrochloric acid resistance | |
| Amount of zinc on inner layer (mg/m$^2$) | Amount of copper on copper layer (mg/m$^2$) | Amount of zinc on outer layer (mg/m$^2$) | Presence or absence of chromate rust resistant layer | Original (kg/cm) | After 10 days at 177° C. (kg/cm) | Success or unsuccess in heat resistance | Ratio of deterioration (%) | Success or unsuccess |
| Example 4 | | | | | | | | |

As illustrated in the above, the copper foil surface-treated in accordance with the process of the present invention is excellent in heat resistance and hydrochloric acid-resistance on preparing a printed circuit board and the process does not require the use of dangerous chemicals such as cyanide and the like and is free from any problems regarding safety, leading to a significantly useful invention.

We claim:

1. A process for treating a surface of a copper foil for producing the copper foil for a printed circuit board, comprising the steps of forming in turn a zinc layer, a copper layer and a chromate rust resistant layer on the surface of the copper foil, the surface of the copper foil being made roughened by electrically depositing a granular copper layer on said surface by burned plating; and then applying a smooth copper plating on said surface at less than or equal to a given limiting current density.

2. The process for treating the surface of the copper foil according to claim 1, wherein a zinc layer is additionally formed between the copper layer and the chromate rust resistant layer.

* * * * *